United States Patent
Ito et al.

(10) Patent No.: US 9,042,195 B2
(45) Date of Patent: *May 26, 2015

(54) CONTROL OF INPUTS TO A MEMORY DEVICE

(71) Applicant: MICRON TECHNOLOGY, INC., Boise, ID (US)

(72) Inventors: Yutaka Ito, Tokyo (JP); Masayoshi Nomura, Ibaraki (JP); Keiichiro Abe, Tsukuba (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/088,762

(22) Filed: Nov. 25, 2013

(65) Prior Publication Data

US 2014/0078849 A1    Mar. 20, 2014

Related U.S. Application Data

(60) Continuation of application No. 13/683,313, filed on Nov. 21, 2012, now Pat. No. 8,611,168, which is a continuation of application No. 13/222,858, filed on Aug. 31, 2011, now Pat. No. 8,325,552, which is a division of application No. 12/795,151, filed on Jun. 7, 2010, now Pat. No. 8,014,222, which is a division of application No. 11/713,875, filed on Mar. 5, 2007, now Pat. No. 7,733,731.

(51) Int. Cl.
| | |
|---|---|
| *G11C 7/00* | (2006.01) |
| *G11C 8/18* | (2006.01) |
| *G11C 7/10* | (2006.01) |
| *G11C 11/406* | (2006.01) |
| *G11C 11/4076* | (2006.01) |

(52) U.S. Cl.
CPC ............. *G11C 8/18* (2013.01); *G11C 7/1078* (2013.01); *G11C 7/109* (2013.01); *G11C 11/406* (2013.01); *G11C 11/40615* (2013.01); *G11C 11/4076* (2013.01); *G11C 2207/2227* (2013.01); *G11C 2211/4067* (2013.01)

(58) Field of Classification Search
USPC .......... 365/189.06, 193, 222, 226, 229, 233.1
See application file for complete search history.

(56) References Cited

U.S. PATENT DOCUMENTS

| | | |
|---|---|---|
| 5,365,487 A | 11/1994 | Patel et al. |
| 5,563,837 A | 10/1996 | Noguchi |

(Continued)

FOREIGN PATENT DOCUMENTS

| | | |
|---|---|---|
| JP | 05-314762 | 11/1993 |
| JP | 06-251581 | 9/1994 |

(Continued)

OTHER PUBLICATIONS

Notice of Rejection for related Japanese Application No. 2008-055226, dated Feb. 1, 2011.

*Primary Examiner* — Hoai V Ho
(74) *Attorney, Agent, or Firm* — Knobbe, Martens, Olson & Bear, LLP

(57) ABSTRACT

A memory device includes a command decoder and control interface logic. One or more external inputs, such as row and column address strobes, communicate with the command decoder through the control interface logic. A control signal is also in communication with the control interface logic. During operation of a drowsy mode in the memory device, a self-refresh signal causes the control signal to disable the external inputs. With the external inputs disabled, command hazards are reduced when exiting drowsy mode.

20 Claims, 14 Drawing Sheets

(56) References Cited

U.S. PATENT DOCUMENTS

| | | |
|---|---|---|
| 5,798,976 A | 8/1998 | Arimoto |
| 5,953,246 A | 9/1999 | Takashima et al. |
| 6,198,689 B1 | 3/2001 | Yamazaki et al. |
| 6,373,752 B1 | 4/2002 | Wright et al. |
| 6,697,992 B2 | 2/2004 | Ito et al. |
| 6,774,714 B2 | 8/2004 | Chida et al. |
| 6,990,031 B2 | 1/2006 | Hashimoto et al. |
| 6,992,946 B2 | 1/2006 | Ooishi |
| 7,733,731 B2 | 6/2010 | Ito et al. |
| 8,014,222 B2 | 9/2011 | Ito et al. |
| 8,611,168 B2 * | 12/2013 | Ito et al. ................ 365/222 |
| 2002/0044010 A1 | 4/2002 | Chida et al. |
| 2002/0163845 A1 | 11/2002 | Ooishi et al. |
| 2004/0192235 A1 | 9/2004 | Ryu et al. |
| 2004/0268018 A1 | 12/2004 | Cowles et al. |
| 2005/0286330 A1 | 12/2005 | Ito et al. |
| 2005/0286331 A1 | 12/2005 | Ito et al. |
| 2006/0013030 A1 | 1/2006 | Arimoto et al. |
| 2006/0140035 A1 | 6/2006 | Lee |
| 2006/0187732 A1 | 8/2006 | Matsuzaki |
| 2006/0200729 A1 | 9/2006 | Ito et al. |
| 2007/0201292 A1 | 8/2007 | Matsuzaki |
| 2008/0151670 A1 | 6/2008 | Kawakubo et al. |

FOREIGN PATENT DOCUMENTS

| | | |
|---|---|---|
| JP | 07-264775 | 10/1995 |
| JP | 10-228768 | 8/1998 |
| JP | 2000-163963 | 6/2000 |
| JP | 2001-035150 | 9/2001 |
| JP | 2002-025270 | 1/2002 |
| JP | 2002-358781 | 12/2002 |

* cited by examiner

CONTROL OF INPUTS TO A MEMORY DEVICE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND OF THE INVENTION

1. Field

This invention relates to control of memory devices, and in particular, control of inputs to memory devices.

2. Description of the Related Art

Random access memory ("RAM") allows a memory circuit to execute both read and write operations on memory cells. DRAM is a specific category of RAM containing an array of individual memory cells, where each cell includes a capacitor for holding a charge and a transistor for accessing the charge held in the capacitor. This charge on the storage capacitors may naturally decay over time, even if the capacitors remain electrically isolated. Thus, DRAM cells require periodic refreshing. Refresh commands may be issued explicitly to the DRAM-based device from another device such as a memory controller. Alternatively, during idle periods, where data is not being read from or written to the DRAM device, the device continuously refreshes without receiving external commands. This process is called "self-refresh." During self-refresh, voltage generators internal to the memory device alternate powering on and powering off to reduce power consumption.

Sometimes a DRAM device will receive a command to exit self-refresh during the power-off phase of the refresh cycle. Because the device is in the power-off state, one or more voltage generators must power on to allow a command decoder to begin executing commands. However, the generators may not reach full power until long after the exit command is received. During this power recovery time, external inputs to the command decoder are unstable. The command decoder may therefore receive and decode a command in error which potentially overwrites or otherwise corrupts portions of data stored in memory.

DETAILED DESCRIPTION OF THE PREFERRED EMBODIMENTS

Various embodiments according to the invention will be described hereinafter with reference to the accompanying drawings. These embodiments are illustrated and described by example only, and are not intended to limit the scope of the invention.

A memory system of various embodiments enters a drowsy mode, wherein the memory system executes self-refresh operations to retain data while simultaneously saving power. Drowsy mode may be entered, for example, when a computer incorporating the memory system enters standby mode. Alternatively, drowsy mode may be entered during tests of the memory system performed during manufacturing of the memory system.

When exiting from drowsy mode, a potential for command hazards exists due to the instability of external inputs to the memory system. One example of a command hazard is untimely execution of a mode register set (MRS) command. The MRS command initializes one or more mode registers, which contain user-defined data regarding memory features such as read latency, burst length, and burst type. The MRS command is typically executed at the start of memory operations. However, if the MRS command also issues during exit from drowsy mode, operations on address banks in the memory system may become unstable, resulting in data being overwritten or otherwise corrupted. Moreover, if the MRS command or other command hazard occurs during testing related to manufacturing, test data may be adversely affected.

Therefore, in certain embodiments, a signal prevents one or more external inputs from initiating a command during exit from drowsy mode. In addition, the signal in various embodiments also controls a clock signal to prevent commands from issuing.

Figure 1:
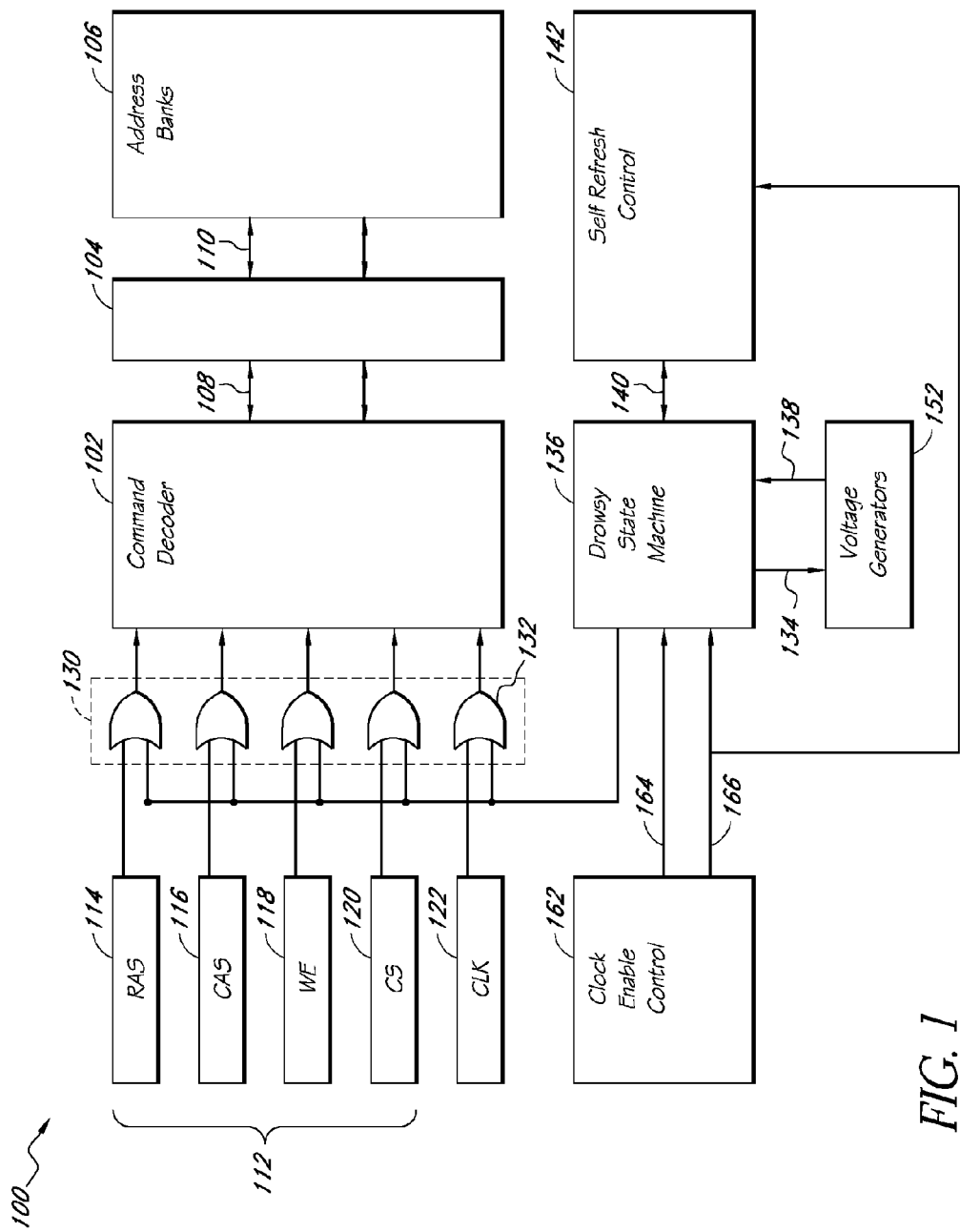
FIG. 1 is an exemplary block diagram showing a memory system according to an embodiment of the invention.

FIG. 1 depicts a memory system 100 in accordance with certain embodiments of the invention. A command decoder 102 receives external inputs 112 through control interface logic 130. Certain combinations of the external inputs 112 determine whether the command decoder 102 issues read, write, MRS, or other commands to an address decoder 104. Address decoder 104 decodes and performs certain commands on the address banks 106, which contain physical memory locations for the storage of data.

A drowsy state machine 136 in certain embodiments selectively initiates and terminates drowsy mode. During drowsy mode, the drowsy state machine 136 also regulates power-on and power-off cycles related to self-refresh operations. The drowsy state machine 136 regulates the power-on and power-off cycles in certain embodiments by communicating with one or more voltage generators 152. The drowsy state machine 136 sends commands to the voltage generators 152 through a generator control signal 134 which alternates between turning the voltage generators 152 on and off, or to a high voltage level and to a low voltage level. In addition, the drowsy state machine 136 receives a generator state signal 138 from the voltage generators 152 which indicates the state of the voltage generators 152, such as whether the voltage generators 152 are at a high or low voltage level.

One or more voltage generators 152 of certain embodiments receive power from a battery or an external power source (not shown). The one or more voltage generators 152 convert the power input into one or more voltages and then transmit the voltages to various components of the memory system 100. Various voltage levels may be employed by the voltage generators 152. Certain of these voltage generators 152 may provide a voltage level that is more appropriate for certain components of the memory system 100 than for others. One of skill in the art will appreciate that many different types of power regulation and conversion circuits may be employed by the voltage generators 152.

A self-refresh control module 142 communicates with the drowsy state machine 136 through bus 140. The self-refresh control module 142 of certain embodiments implements refresh cycles during the power-on cycles of drowsy mode, as described in further detail below in connection with FIG. 2.

A clock enable control module 162 in various embodiments transmits a self-refresh signal 164 to the drowsy state machine 136 and to the self-refresh control module 142. The clock enable control module 162 transmits the self-refresh signal 164 in response to the command decoder 102 receiving a self-refresh command. Alternatively, the clock enable control module 162 transmits the self-refresh signal 164 in response to a user-initiated action, such as the entering of standby mode on a computer. In addition, the clock enable control module 162 sends a clock enable signal 166 to the drowsy state machine 136.

The external inputs 112 in certain embodiments include a row address strobe (RAS) 114, a column address strobe (CAS) 116, a write enable (WE) signal 118, and a chip select (CS) signal 120. Various combinations of the external inputs 112 generate commands that are transmitted to the command decoder 102. In certain embodiments, an external memory controller (not shown) determines which commands are to be run and activates the appropriate external inputs 112 accordingly. RAS 114 and CAS 116, for example, may be activated in combination with the WE signal 118 to communicate read and write commands to the command decoder 102. RAS 114, CAS 116, or both RAS 114 and CAS 116 may also perform refresh operations on the address banks 106. In addition, the CS signal 120 enables the command decoder 102 to issue commands such as read, write, and refresh commands.

A clock signal 122 coordinates the actions of various components of the memory system 100, including the actions of the command decoder 102. The clock signal 122 may, for instance, cause the external inputs 112 to issue from the command decoder 102, as depicted in embodiments of FIG. 3, below. When the clock signal 122 is active, commands may issue from the command decoder 102, but when the clock signal 122 is inactive, commands may not issue from the command decoder 102.

A control signal 124 is gated with the external inputs 112 at control interface logic 130. The depicted embodiment of the control interface logic 130 includes OR gates 132. In certain embodiments, while the control signal 124 is enabled, each OR gate 132 outputs a constant value. This constant value in certain embodiments is transmitted to the command decoder 102 regardless of the values of external inputs 112. Consequently, the control signal 124 of certain embodiments disables the external inputs 112 to the command decoder 102. The control signal 124 therefore prevents the external inputs 112 from accidentally communicating faulty commands to the command decoder 102.

In certain embodiments, the control interface logic 130 may include fewer OR gates 132 such that fewer than all external inputs 112 are gated with the control signal 124. In such instances, the control signal 124 disables fewer than all of the external signals 112. The control signal 124 may disable only the CS signal 120, for example, or only the RAS 114 and CAS 116 inputs, or any other combination of the external inputs 112. Disabling only a portion of the external inputs 112 in certain embodiments still prevents issuance of faulty commands. In addition, disabling fewer than all of the external inputs 112 prevents issuance of an MRS command because the MRS command of various embodiments issues when all the external inputs 112 are low, as illustrated more fully under FIG. 3, below.

In certain embodiments, the control interface logic 130 comprises an OR gate. This OR gate is used on the clock signal 122, and the control signal 124 therefore disables the clock signal 122. By overriding the clock signal 122, the control signal 124 also prevents the command decoder 102 from issuing faulty commands. In alternative embodiments, the external inputs 112 may be gated with OR gates 132 while the clock signal 122 is not gated with an OR gate 132. In such instances, the external inputs 112 and not the clock signal 122 are disabled.

Furthermore, other forms of logic structures may be used in place of the OR gate, including NAND, NOR, and other logic gates. Combinations of such logic gates may also be employed, including multiplexers (MUXes), decoders, and so forth. For example, each external input 112 might be an input to a decoder containing one or more AND gates, and the control signal 124 might be gated with the AND gates to selectively prevent one or more external inputs from issuing a command. Several options are therefore available for using the control signal 124 to prevent command hazards from occurring.

Figure 2:
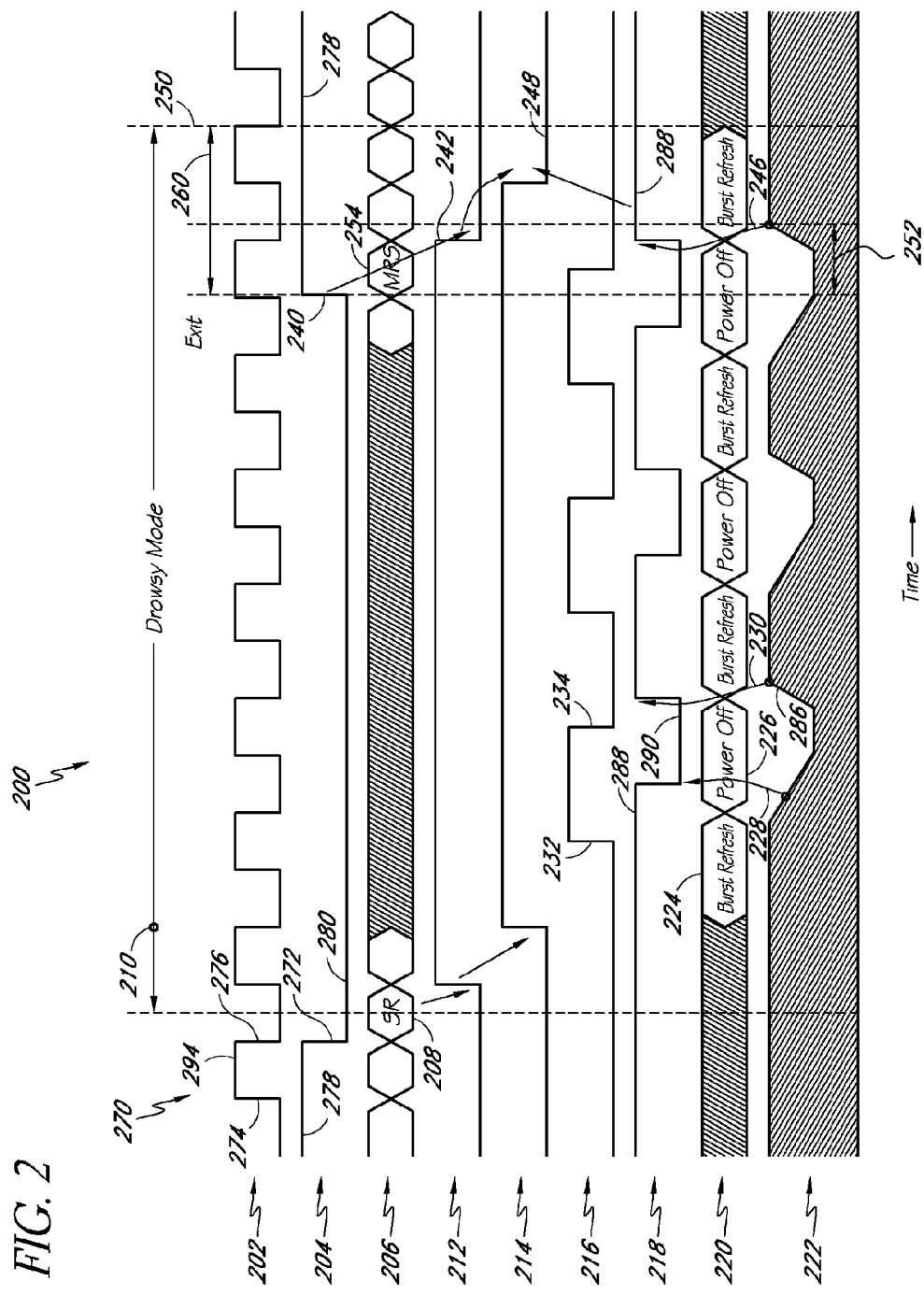
FIG. 2 is an exemplary timing diagram showing timing of signals and commands in a memory system according to an embodiment of the invention.

FIG. 2 illustrates a timing diagram 200 in accordance with certain embodiments of a memory system. On the timing diagram 200, various signals and commands are represented on one axis, and time is represented on the other axis. The timing diagram 200 therefore depicts the progression of these signals and commands with respect to time. The signals and commands depicted in the timing diagram 200 may be implemented in a memory system, and in certain embodiments, the depicted signals and commands are implemented in the memory system 100.

A clock signal 220 is represented by pulses 270 on the timing diagram 200. The pulses 270 oscillate in time between high and low states. In certain embodiments, a rising edge 274 or falling edge 276 of the clock signal 220 triggers or activates certain signals or commands in the timing diagram 200. In addition, the clock signal 220 may trigger signals or commands with plateau 290 of the pulse 270. Commands 206, for example, may be issued according to the pulses 270 of the clock signal 220. These commands 206 are issued in certain embodiments by external inputs to a memory system and are received by a command decoder.

A clock enable signal 204 changes from a high state 278 to a low state 280 at 272. While in the high state 278, the clock enable signal 204 is enabled, allowing certain components of a memory system to operate according to the pulses 270 of the clock signal 220. A low state 280 of the clock enable signal 204 indicates that portions of the memory system are no longer ready to process commands 206. In certain embodiments, the transition of the clock enable signal 202 to a low state 280 indicates that a memory system incorporating a command decoder is preparing to enter drowsy mode.

After the clock enable signal 204 goes to a low state 280, a self-refresh command 208 issues. The self-refresh command 208 initiates drowsy mode 210, as shown by a vertical line drawn through the timing diagram 200. The self-refresh command 208 causes a self-refresh signal 212 to be enabled, as indicated by an arrow from the self-refresh command 208 to the self-refresh signal 212. Enabling of the self-refresh signal 212 in turn causes a control signal 214 to be enabled, as also indicated by an arrow.

The self-refresh signal 212 of certain embodiments initiates self-refresh operations 220. Self-refresh operations 220 may include alternating burst refresh 224 and power-off cycles 226. Burst refresh 224 cycles refresh portions of address banks, one right after the other, until a set of address banks has been refreshed. In alternative embodiments, other types of refresh may be used as will be understood by one of skill in the art.

During burst refresh cycles 224, the voltage 222 of one or more voltage generators is at a high level. As a power-off cycle 226 commences, the voltage 222 decreases at 228 to a low level. As power-off cycle 226 ends, the voltage 222 returns to a high level at 230. In the depicted embodiment, the voltage 222 does not instantaneously return to a high level but rather increases steadily over time until the high voltage level is reached. This steady increase is indicated by slope 286, which graphically depicts a rise in the voltage 222 over time. Certain embodiments of the invention contemplate that the voltage 222 might have a different slope 286, such that the voltage 222 returns to a higher level at a faster or slower rate than the depicted embodiment. In addition, certain embodiments of the voltage 222 include a high level of 3.2 volts and a low level of 1.3 volts. Alternatively, the high level of the voltage 222 may be high with respect to the low level, and therefore both the high and low levels of the voltage 222 may include a zero voltage, a negative voltage, or some other positive voltage.

A generator state signal 218 indicates the state of the voltage 222. When the voltage 222 is high, the generator state signal 218 is also at a high state 288. When the voltage 222 decreases at 228, the generator state signal 218 switches to a low state 290. When the voltage 222 returns to a high state, such as at 230, the generator state signal 218 returns to a high state 288. Consequently, the generator state signal 218 indicates whether the voltage 222 has decreased or increased. In certain embodiments, the generator state signal 218 transmits this information to a drowsy state machine.

A generator control signal 216 is low when the voltage 222 is at a high level. The generator control signal 216 switches to a high state, for example at 232, to initiate the power-off cycle 226 of self-refresh operations 220. The transition from low to high states of the generator control signal 216 in certain embodiments causes the voltage 222 to go to a low state. The generator control signal 216 thereafter returns to a low state at 234 to terminate the power-off cycle 226. By returning to the low state, the generator control signal 216 causes the voltage 222 to return to a high level. In certain embodiments, a drowsy state machine selectively sets the generator control signal 216 at high and low states and thereby controls the powering on and off one or more voltage generators.

In certain embodiments, burst refresh 224 and power off 226 cycles continue until the memory system initiates exit from drowsy mode at 240. Exit begins at 240 when the clock enable signal 204 returns to a high state 278, and exit completes at 250 when the last burst refresh cycle has occurred. Alternatively, exit may begin at another time, such as when a command to stop self-refresh is received. Likewise, exit may complete at various times before or after a final burst refresh cycle is performed. The total time for the memory system to exit drowsy mode in the depicted embodiment is represented by exit time 260.

Occasionally exit will occur during a power-off cycle 226 of self-refresh operations 220, such as in the depicted embodiment at 240. At the time of exit at 240, the voltage 222 is therefore at a low level. In order to resume normal, e.g., non-self-refresh operations of the memory system, the voltage 222 in certain embodiments returns to a high level. The period of time between exit at 240 and the voltage 222 returning to a high level is called power recovery 252.

During power recovery 252, one or more external inputs to the memory system may be unstable. In addition, the clock signal 220 may be unstable. In currently available devices, the instability of one or more external inputs causes one or more commands to issue to the command decoder. Moreover, the instability of the clock signal 220 in currently available devices may cause the command decoder to decode these commands. However, in embodiments of the memory system, during power recovery 252, the control signal 214 remains at a high state. In its high state, the control signal 214 may disable one or more unstable external inputs and thereby prevent the external inputs from issuing commands to the command decoder. In addition, the control signal 214 may disable the clock signal 220 and thereby prevent the command decoder from decoding any commands. Consequently, the control signal 214 of certain embodiments prevents command hazards from occurring.

Enabling the clock enable signal at 240 causes the self refresh signal 212 to go to a low state at 242. The increase of the voltage 222 at 246 causes the generator state signal 218 to go to a high state 288. In the depicted embodiment, because the self refresh signal 212 is at low state at 242, the high state 288 of the generator state signal 218 causes the control signal 214 to go to a low state 248. The relationship between the self-refresh signal 212 and the generator state signal 218 is shown in greater detail in FIGS. 4 and 5 below.

The control signal 214 is therefore low by the time drowsy mode 210 ends at 250. Because the control signal 214 is low, it no longer disables the external inputs or clock signal 220. Consequently, external inputs can issue commands to the command decoder after drowsy mode 210 ends, and the command decoder can decode the commands. The timing diagram 200 therefore illustrates that in certain embodiments, enabling the control signal 214 prevents command hazards from occurring during power recovery time 252, and that disabling the control signal 214 allows commands to run during normal operation.

Figure 3:
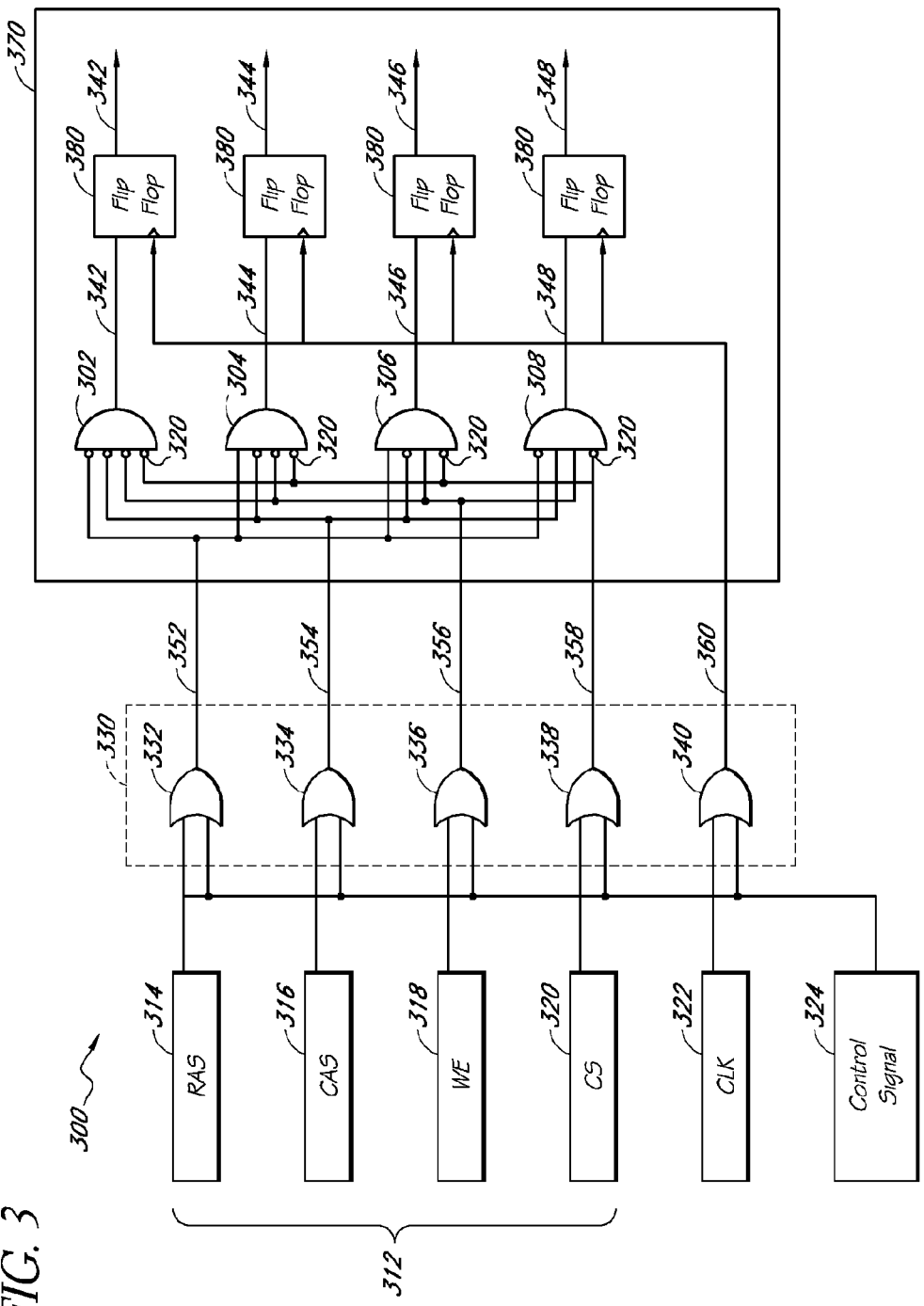
FIG. 3 is an exemplary block diagram showing further embodiments of a memory system.

FIG. 3 depicts components of a memory system 300 in accordance with certain embodiments of the invention. The depicted memory system 300 includes external inputs 312 in communication with a command decoder 370 through control interface logic 330. A clock signal 322 is also in communication with the command decoder 370 through the control interface logic 330. In addition, a control signal 324 is shown gated with each external input 312 as well as with the clock signal 322 at the control interface logic 330.

The external inputs 312 in certain embodiments are similar to the external inputs 112 described above in the memory system 100. The RAS 314, CAS 316, WE 318, and CS 320 signals of certain embodiments therefore include similar functionality as corresponding inputs in the memory system 100. Likewise, the control interface logic 330 of the depicted embodiment incorporates some or all of the functionality of the control interface logic 130, for example by including one or more OR gates 332, 334, 336, 338, and 340, in communication with the external inputs 312 and with the command decoder 370. Though not shown, fewer OR gates may be employed in the control interface logic 330, and different logic gates, transistors, or the like may also be employed in place of the OR gates 332, 334, 336, 338, and 340, such as MUXes, decoders, and the like.

Each OR gate 332, 334, 336, 338, and 340 in the depicted embodiment transmits a respective output value 352, 354, 356, 358, or 360 to the command decoder 370. Within the command decoder 370, the outputs 352, 354, 356, and 358 are transmitted to one or more AND gates 302, 304, 306, and 308. Certain outputs 352, 354, 356, or 358 are also transmitted to one or more NOT gates 320 in communication with certain AND gates 302, 304, 306, or 308. The NOT gates 320 in conjunction with each AND gate 302, 304, 306, or 308 decode the external inputs 312 and issue a command signal 342, 344, 346, or 348 corresponding to those external inputs 312 to flip flops 380.

The flip flops 380 of certain embodiments contain one or more logic gates (not shown), which in combination store the respective outputs 342, 344, 346, and 348 of respective AND gates 302, 304, 306, and 308. In addition, the flip flops 380 receive a signal 360 as input from the OR gate 340. The signal 360 in various embodiments transmits the clock signal 322 to the flip flops 380. At each pulse of the clock signal 322, the flip flops 380 of certain embodiments transmit the previously received outputs 342, 344, 346, and 348 to other portions of the memory system 300. Though not shown, latches or other forms of one-bit storage devices may be used in place of the flip flops 380.

In one example, NOT gates 320 communicate with AND gate 302 to decode a possible MRS command. If all of the external inputs 312 are at a low or logic 0 state, each NOT gate 320 will output a high or logic 1 value. If all of the values from the NOT gates 320 in communication with the AND gate 302 are a logic 1, then the AND gate transmits a signal 342 having a logic 1 value to a flip flop 380. When the flip flop 380 transmits a signal 342 having a logic 1 value in response to a cycle of the clock signal 322, an MRS command will be issued by the command decoder 370. Similarly, if the AND gate 304 outputs a signal 344 having a logic 1 value, the command decoder 370 will issue a write command to an address decoder, such as the address decoder 104 of FIG. 1. Likewise, a logic 1 value of the signal 346 indicates that a read command should occur, and a logic 1 value of the signal 348 indicates that an activate command should occur, which allows a portion of memory to receive read or write commands. One of skill in the art will appreciate that additional commands may be decoded by additional NOT and AND gates (not shown). In addition, one of skill will understand that other logic circuitry may be used in place of the NOT and AND gates to decode commands.

A control signal 324 is gated with the external inputs 312 at control interface logic 330. In certain embodiments, while the control signal 324 is enabled, each OR gate 332, 334, 336, and 338 outputs a constant logic 1 value. This constant value is transmitted to the NOT and AND gates 302, 304, 306, and 308 in the command decoder 370 regardless of the values of the external inputs 312. One or more NOT gates 320 in communication with each AND gate 302, 304, 306, and 308 inverts the constant logic 1 output from the control interface logic 330, causing each AND gate to output a logic 0. Because each AND gate outputs a logic 0, none of the command signals 342, 344, 346, and 348, including the MRS command signal 342, will issue a command. In such instances, the constant logic 1 value presented by the control signal 324 constitutes a no-operation, or NOP command.

Moreover, the AND gates 302, 304, 306, 308 in certain embodiments require their inputs to be a logic 1 value in order to output a logic 1 value. Because at least one NOT gate 320 is in communication with each AND gate in the depicted embodiment, a constant logic 1 value input from the control signal 324 will be inverted and cause each AND gate 302, 304, 306, 308 to output a logic 0 value. Therefore, an OR gate 332, 334, 336, and 338 in certain embodiments is needed on one of the external inputs 312 to prevent certain command signals 342, 344, 346, or 348 from issuing. Thus, any of RAS 314, CAS 316, WE 318, and CS 320 may be gated with the control signal 324 to prevent the issuance of one or more command signals 342, 344, 346, or 348. In certain embodiments, however, gating multiple or all external inputs 312 with the control signal 324 provides redundancy against issuing faulty command signals 342, 344, 346, or 348.

Additionally, gating the clock signal 322 with control signal 324 through OR gate 340 provides further redundancy by allowing the control signal 324 in certain embodiments to disable or override the clock signal 322. When the clock signal 322 is disabled, the output signal 360 transmits a constant value to the flip flops 380. Because flip flops in various implementations transmit values according to clock signal 322 pulses, a constant value output signal 360 causes the flip flops 380 to cease transmitting output values. The flip flops 380 therefore cannot issue commands to other components in the memory system, thereby providing additional security against commands hazards.

One of skill in the art will further appreciate that the clock signal 322 may or may not be gated with the control signal 324 in order to provide a level of desired redundancy in protecting against issuing faulty command signals. Likewise, one of skill in the art will appreciate that various other circuit components may be used in place of the OR gates 332, 334, 336, 338, and 340, NOT gates 320, and AND gates 302, 304, 306, 308 in the depicted embodiment. Therefore, the control signal 324 of the memory system 300 is a versatile control mechanism for preventing command hazards.

Figure 4:
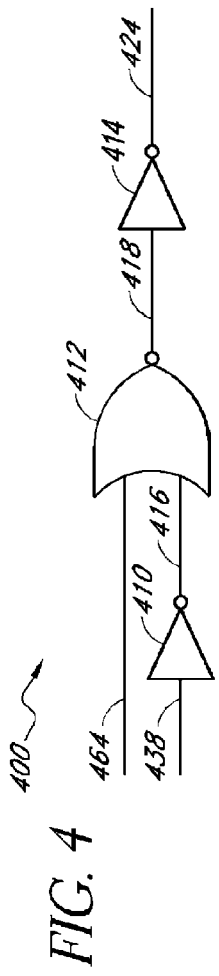
FIG. 4 is an exemplary schematic diagram showing refresh interface logic according to an embodiment of the invention.

FIG. 4 depicts certain embodiments of refresh interface logic 400. Depicted embodiments of the refresh interface logic 400 include a NOR gate 412 in communication with a NOT gate 410 and in further communication with a NOT gate 414. The NOR gate 412 receives two inputs, namely a self-refresh signal 464 and an inverted signal 416. The inverted signal 416 is an inverted form of a generator state signal 438, due to an inversion operation performed by the NOT gate 410 on the generator control signal 438. The NOR gate 412 outputs a signal 418 which is inverted by the NOT gate 414. The NOT gate 414 in turn outputs a control signal 424.

In the depicted embodiment, the NOR gate 412 and NOT gate 414 combine to output a logic OR value of the self-refresh signal 464 and the inverted signal 416. Thus, the refresh interface logic 400 outputs a logic 1 value as the control signal 424 if either the self-refresh signal 464 or the inverted signal 416 has a logic 1 value. Said another way, if the self refresh signal 464 is a logic 1 value or if the generator state signal 438 is a logic 0 value, the control signal 424 will output a logic 1 value. Thus, either the self-refresh signal 464 or the generator state signal 438 may enable the control signal 424. Likewise, in certain embodiments changing the self-refresh signal 464 to a logic value 0 and the generator state signal to a logic 1 value disables the control signal 424.

Figure 5:
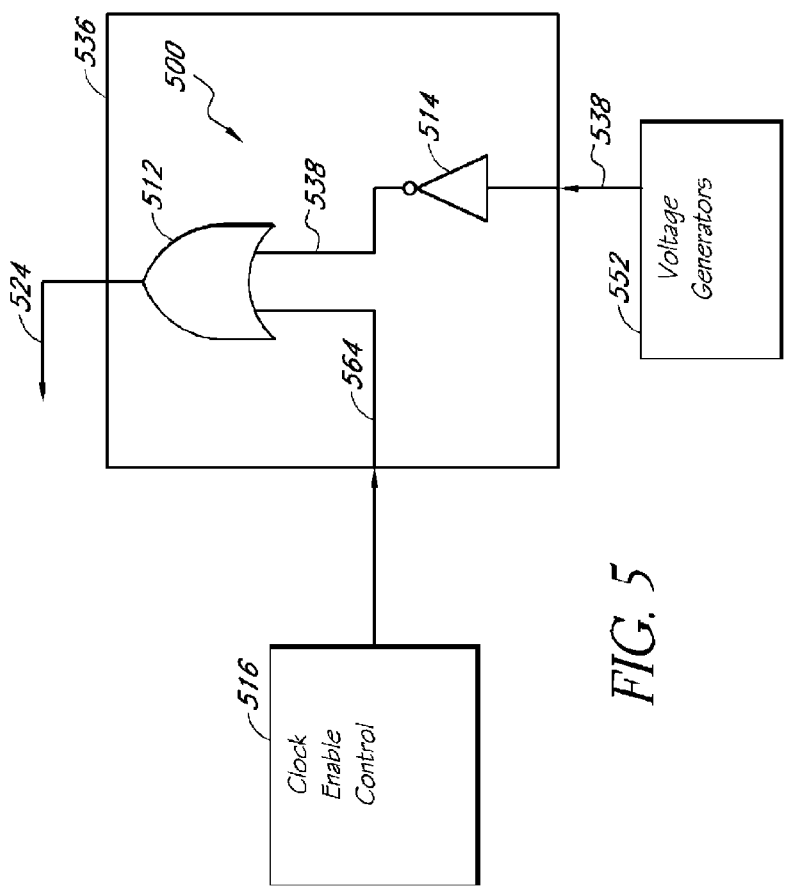
FIG. 5 is an exemplary schematic diagram showing another embodiment of the refresh interface logic.

FIG. 5 depicts further embodiments of refresh logic 500 in relation to certain components of a memory system. The refresh logic 500 is depicted as being incorporated in a drowsy state machine 536. The refresh logic 500 includes an OR gate 512 and a NOT gate 514. The OR gate 512 receives two inputs, namely a self-refresh signal 564 from clock enable control module 516 and an inverted signal 538. The inverted signal 538 is the output of the NOT gate 514, which receives a generator state signal 538 from a voltage generator 552. The output of the refresh logic 500 is a control signal 524. In certain embodiments, the refresh logic 500 is not inside the drowsy state machine 536 but is instead at another location in the memory system.

Figures 6, 7:
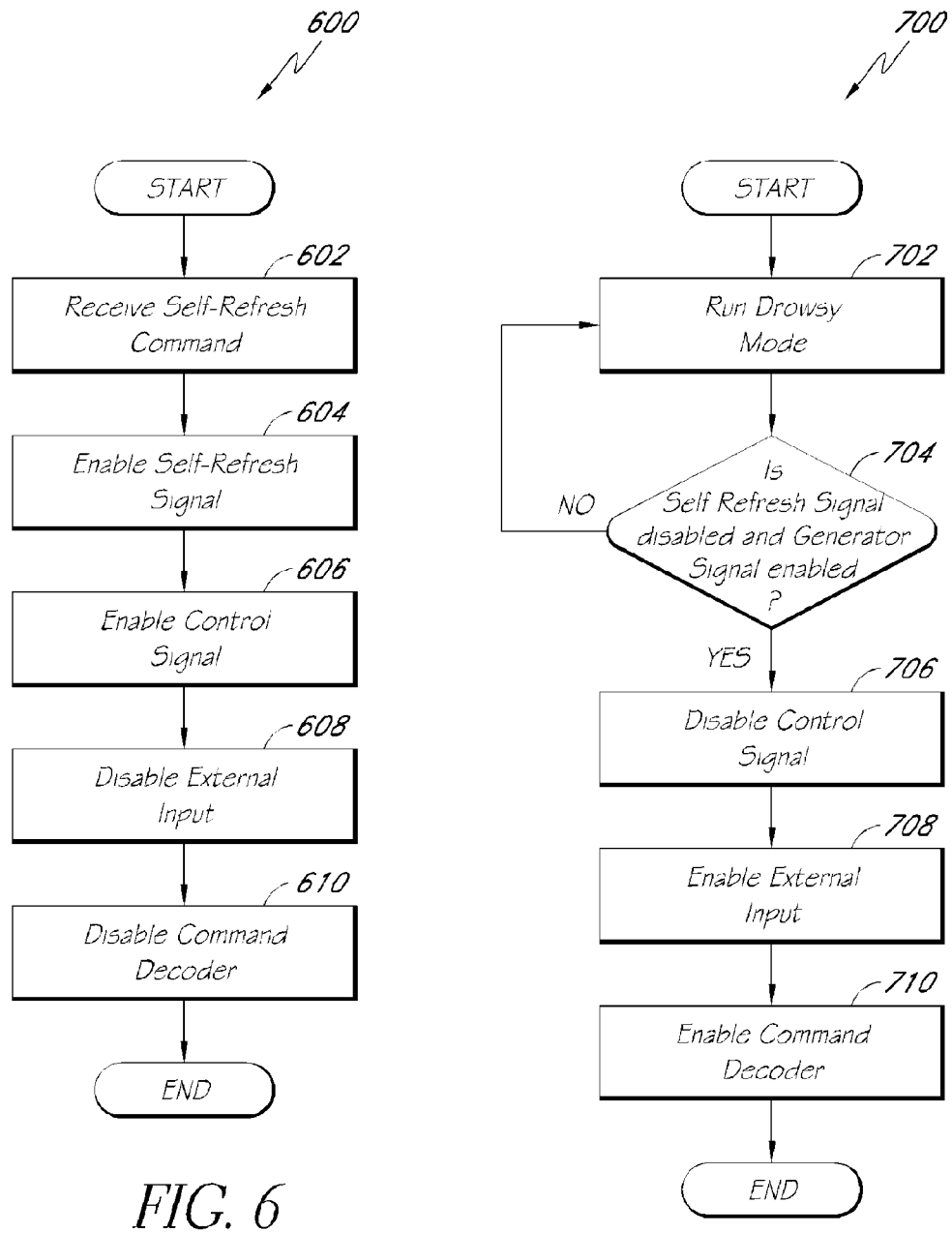
FIG. 6 is an exemplary flowchart showing a process for controlling signals according to an embodiment of the invention.
FIG. 7 is an exemplary flowchart showing another embodiment of a process for controlling signals.

FIG. 6 depicts a method 600 for controlling signals in accordance with certain embodiments of the invention. At 602, a self-refresh command is received, for example, by a command decoder. At 604, a self-refresh signal is enabled. At 606 a control signal is enabled. In certain embodiments, the enabling of the self-refresh signal at 604 causes the control signal to be enabled at 606. An external input is disabled at 608, and in certain embodiments the external input is disabled by the control signal. The command decoder is also disabled at 610, and in certain embodiments, the disabling of the external input at 606 disables the command decoder at 610.

Because the command decoder is disabled at 610, commands such as the MRS command, write commands, and the like may not issue. The method 600 therefore prevents command hazards from occurring and therefore improves the stability of a memory system incorporating the method 600. Moreover, in certain embodiments, the method 600 is performed by any of the memory systems or by components of the memory systems described above.

FIG. 7 depicts further embodiments of a method 700 for controlling signals. At 702, drowsy mode runs. At 704, it is determined whether a self-refresh signal is disabled and whether a generator state signal is enabled. If either the self-refresh signal is disabled or the generator state signal is enabled, then at 706 a control signal is disabled. However, if the self-refresh signal is not disabled and the generator state signal is not enabled, then the process loops back to 702.

If the control signal is disabled, then an external input is enabled at 708. In turn, a command decoder is enabled at 710 allowing commands to be processed. In certain embodiments, the method 700 is performed by any of the memory systems or by components of the memory systems described above.

FIGS. 8 through 17 illustrate more detailed examples of various embodiments of a memory system 800 and waveforms produced by the memory system 800. In the depicted embodiment, the memory system 800 includes certain embodiments of components in the memory system 100 described in more detail above. For example, the memory system 800 includes a command decoder 802, a drowsy state machine 836, a self-refresh control module 842, a clock enable control module 862, voltage generators 852, external inputs 812, control interface logic 830 in communication with the command decoder 802, and a control signal 824. Additionally, the memory system 800 includes a generator control signal 890, a generator state signal 838, a clock enable signal 866, and a self-refresh signal 864. In one embodiment, these components have similar or the same functionality as their counterparts in the memory system 100. Advantageously, the memory system 800 reduces or overcomes various problems encountered in currently available memory devices, such as freeze failure, command hazards, and unexpected long exit times from drowsy mode.

Figure 16:
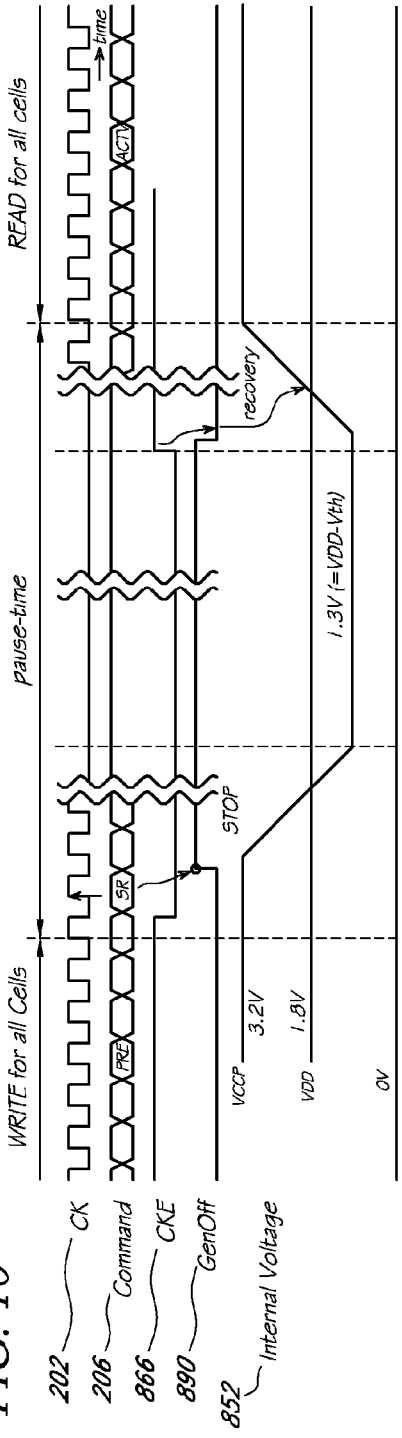
FIG. 16 is an exemplary timing diagram showing timing of signals and commands in a memory system according to an embodiment of the invention.

Freeze failure occurs in conventional memory devices when the generator control signal 890 is accidentally enabled at power-on of the memory device, which improperly turns off the voltage generators 852. In some implementations, this problem is reduced by clock enable logic 872, which gates the generator control signal 890 with the clock enable signal 866. As shown in the waveform diagram of FIG. 15, if the generator control signal 890 wrongly activates, when the clock enable signal 866 goes high the voltage generators 852 recover and freeze failure is averted. FIG. 16 illustrates that proper clock enable control in some implementations can also enable testing of power-off mode to be performed.

However, in some deep-submicron devices, this form of clock enable control is less effective because the clock enable signal 866 cannot be detected. Since the external clock enable ("CKE") input 812 into the clock enable control module 862 is controlled with internal voltage from the voltage generators 852, when the voltage generators 852 power down, the clock enable logic 872 cannot detect the clock enable signal 866.

Freeze failure also adversely affects testing of memory devices during manufacturing. Once a memory device falls to the power-off state during testing, it cannot return to the idle-state. In addition, in currently available devices, a supply voltage (SV) detected signal from the SV detector 875 cannot reset or clear power-off mode (e.g., the power-off cycles of drowsy mode). Certain drowsy mode tests therefore may not perform correctly.

In addition to freeze failure, an unexpected long exit time occurs from the memory device not being able to detect the clock enable signal 866 during the power-off state. If an exit operation (e.g., the exit time 260 shown in FIG. 2 above) occurs during power-off mode, the exit time 260 will be very long due to including both power-off time and the last burst-refresh time. The last burst-refresh time in conventional devices must be performed because the device cannot interrupt power-off mode. This is often not desirable since a short exit time is better for almost all applications.

Various embodiments of the memory system 800 reduce or overcome these problems. In some implementations, multiple solutions may be combined together, or alternatively, only a portion of the solutions described herein will be implemented.

One solution employed in certain embodiments is to perform path-gate 876 control with both voltage VCCP (from the voltage generators 852) and voltage $V_{DD}$ 874 placed on the clock enable control module 862 input-path. With the voltage $V_{DD}$ 874 placed on the path-gates 876, the path-gates 876 in one embodiment are transmission gates. The external clock enable signal 812 can be detected by the clock enable control module 862 through the path-gate 876 controlled with voltage $V_{DD}$ 874 even if the memory system 800 enters power-off mode. Freeze failure is thus avoided because the generator control signal 890 is gated with a stable clock enable signal 866. This solution can also solve or reduce problems related to power-off testing and unexpected long exit-time. In one embodiment, however, this implementation is less effective in lower voltage $V_{DD}$ 874 devices.

Figure 8:
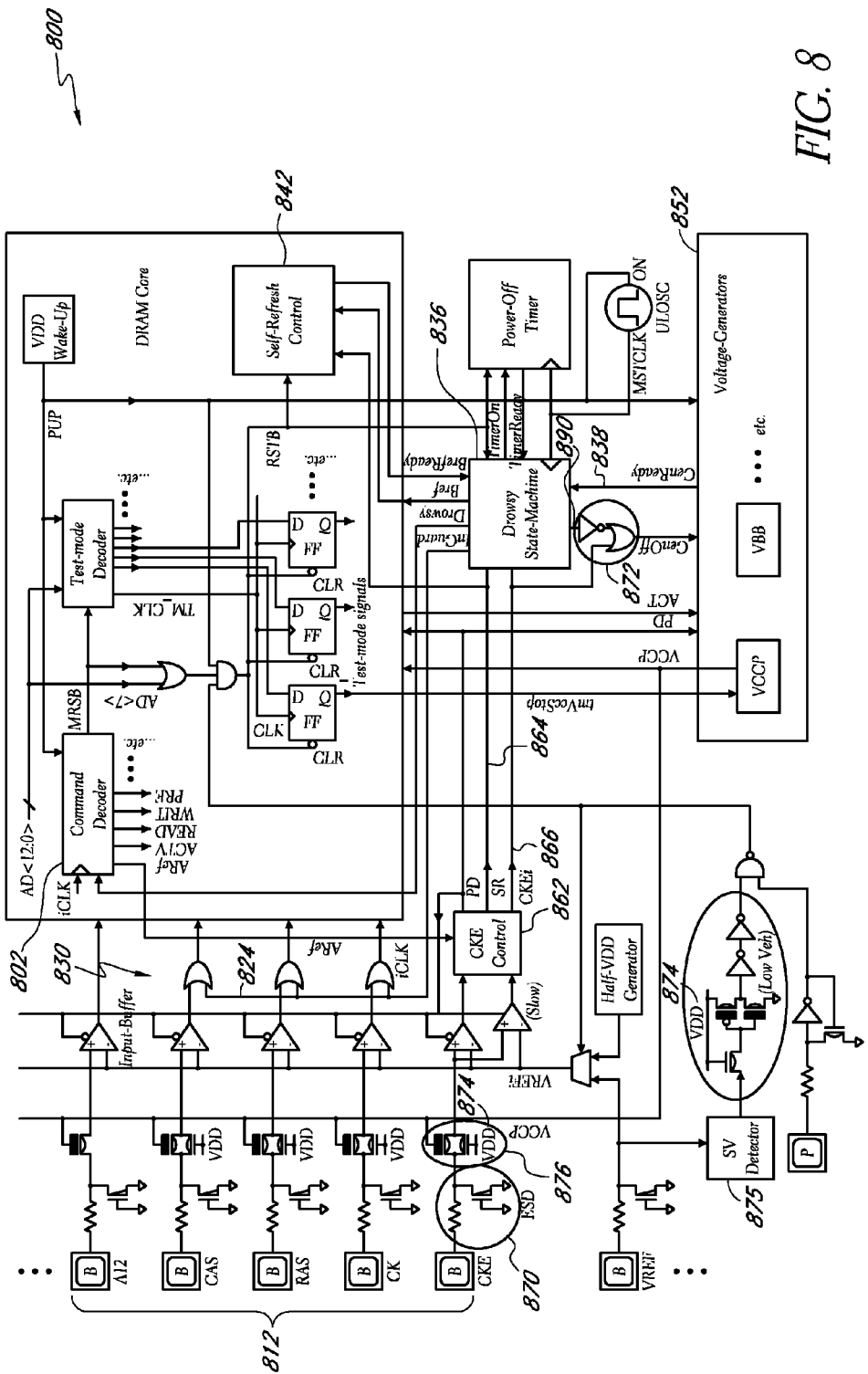
FIG. 8 is an exemplary block diagram showing a memory system according to an embodiment of the invention.
Figure 9:
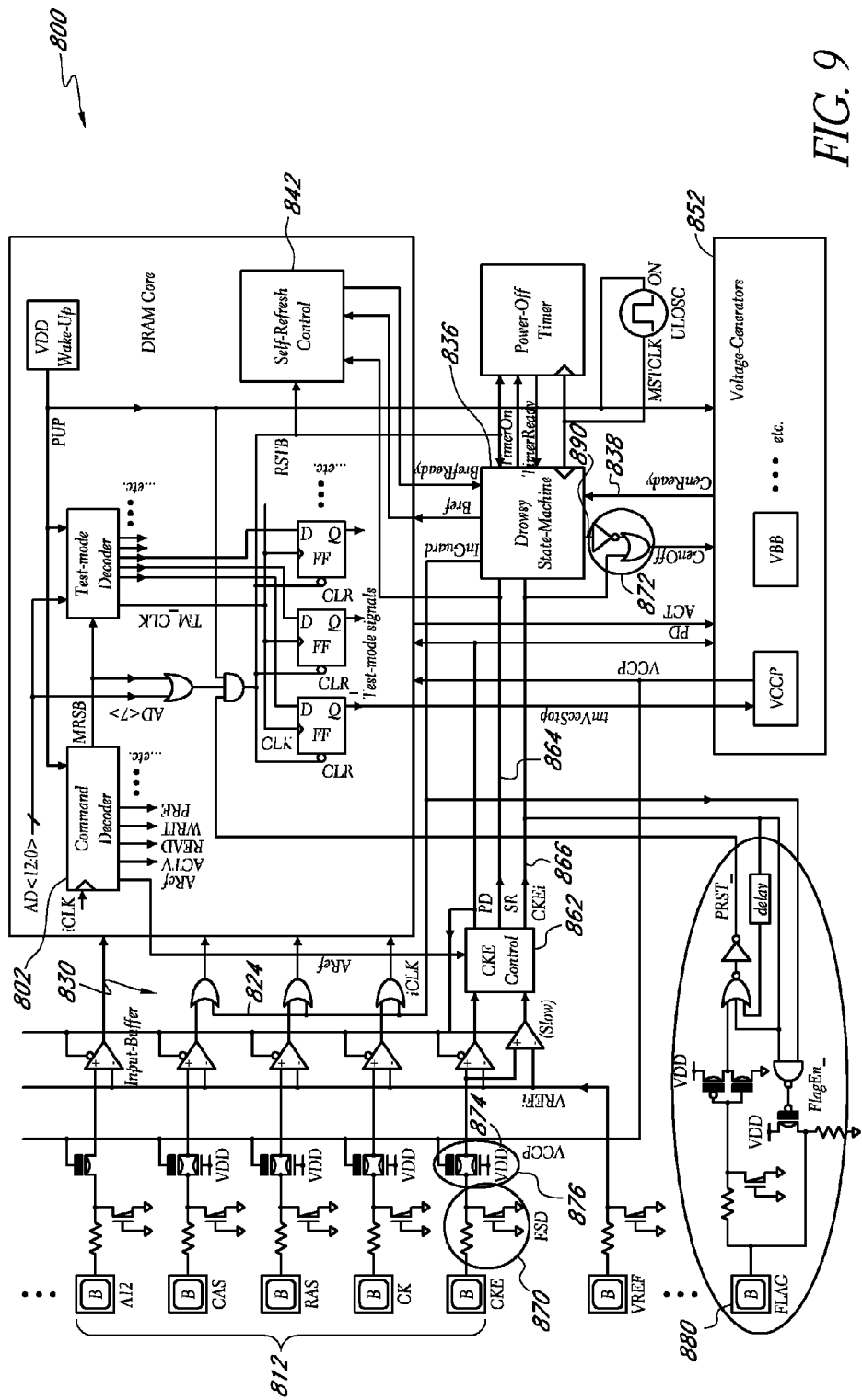
FIG. 9 is an exemplary block diagram showing a memory system according to an embodiment of the invention.

In another embodiment, the external inputs 812 are controlled with both the voltage VCCP from the voltage generators 852 and the voltage $V_{DD}$ 874 placed on some or all of the path-gates 876. In addition, a control signal 824 ("Inguard";

see FIGS. 8, 9) from the drowsy state machine 890 may be applied to the external inputs 812 via control interface logic 830, which in one embodiment is the same as the control signal 124 of the memory system 100 described above. In these implementations, the memory system 800 is able to keep the external inputs 812 enabled so that command hazards can be avoided. In one embodiment, the control signal 824 also reduces command hazards more effectively than controlling path-gates 876 in lower voltage $V_{DD}$ 874 devices.

Figure 10:
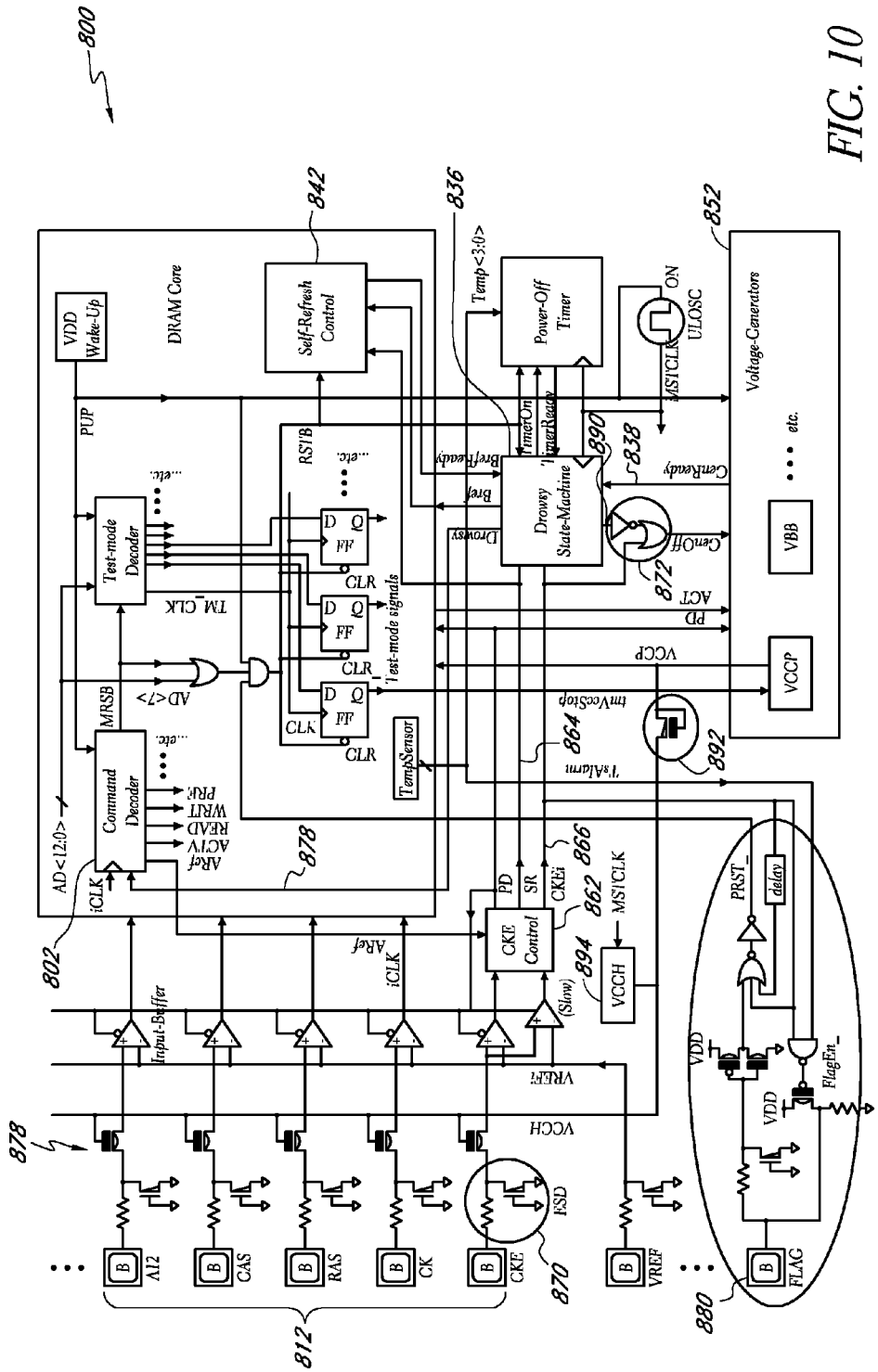
FIG. 10 is an exemplary block diagram showing a memory system according to an embodiment of the invention.

In still another embodiment, a voltage VCCH 894 may be added to the input-buffers (as seen, e.g., in FIG. 10). In certain embodiments, the voltage VCCH 894 does not depend on power-off mode, keeping a high voltage on the path gates 878 to supplement the voltage VCCP from the voltage generators 852, even during power-off mode. However, since the voltage VCCH 894 is not always stopped in some implementations, current from the voltage generator VCCH 894 may be negligible to meet low power. So, the voltage VCCH 894 is generated with an ultra low speed oscillator (ULOSC) that clocks a state-machine (denoted by the MSTCLK signal from the ULOSC in FIG. 10). In addition, since the voltage VCCH 894 power-on time in some embodiments is very slow, the voltage VCCH 894 has a clamp-MOS transistor 892 (e.g., as seen in FIG. 10) connected to the VCCP voltage generator 852 for assistance in reaching full voltage levels.

State-control may also be employed to control the command-decoder 802 via a drowsy signal 878. In cases where fast burst-refresh is done internally (see e.g., FIG. 13), at the switching time from internal operation to external operation, there is a potential for command hazards to occur since external commands on the external inputs 812 would be entered before exit-time. The command decoder 802 is therefore controlled in certain embodiments with a state control signal called the drowsy signal 878.

Figure 12:
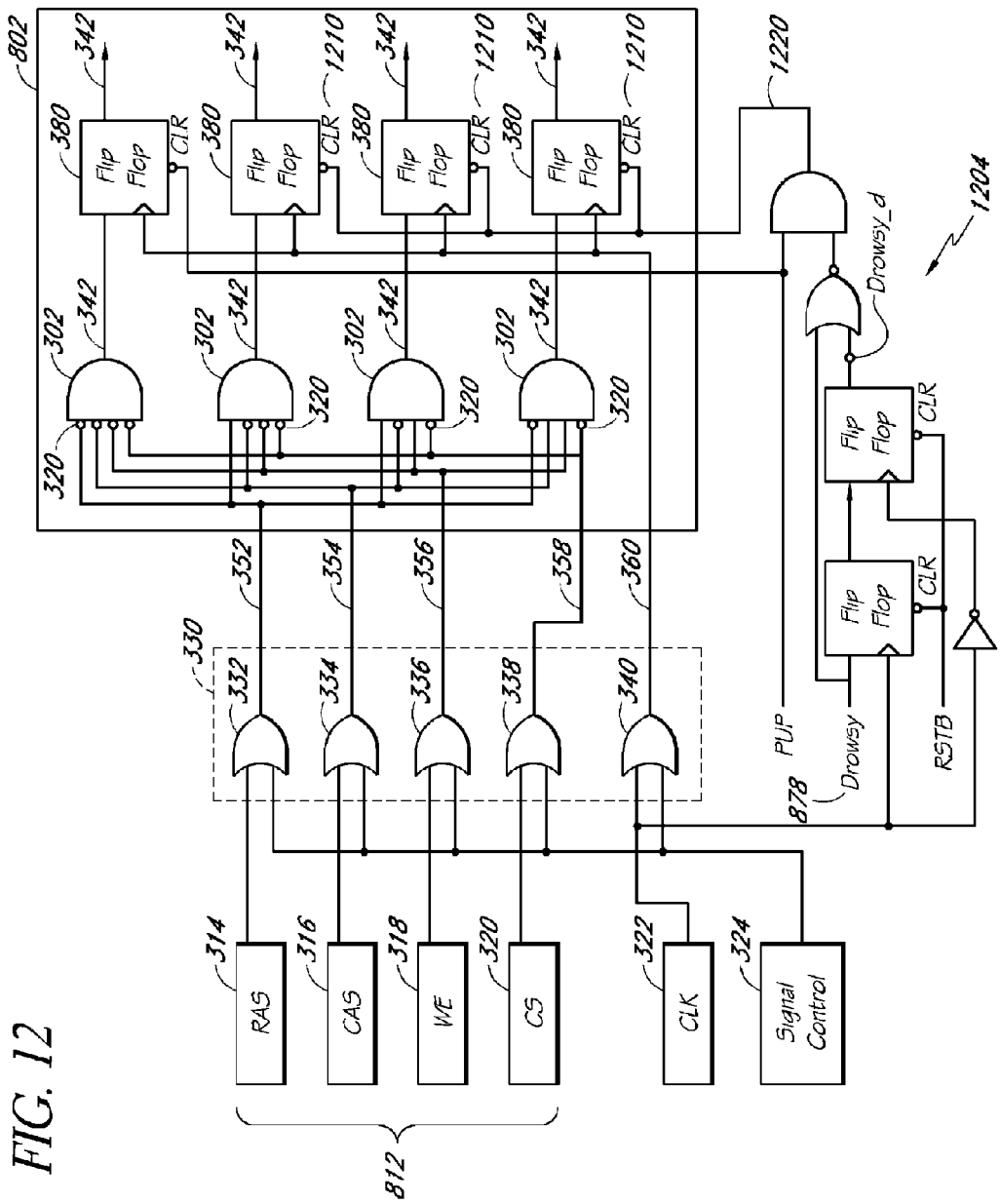
FIG. 12 is an exemplary schematic diagram showing further embodiments of a memory system.
Figure 13:
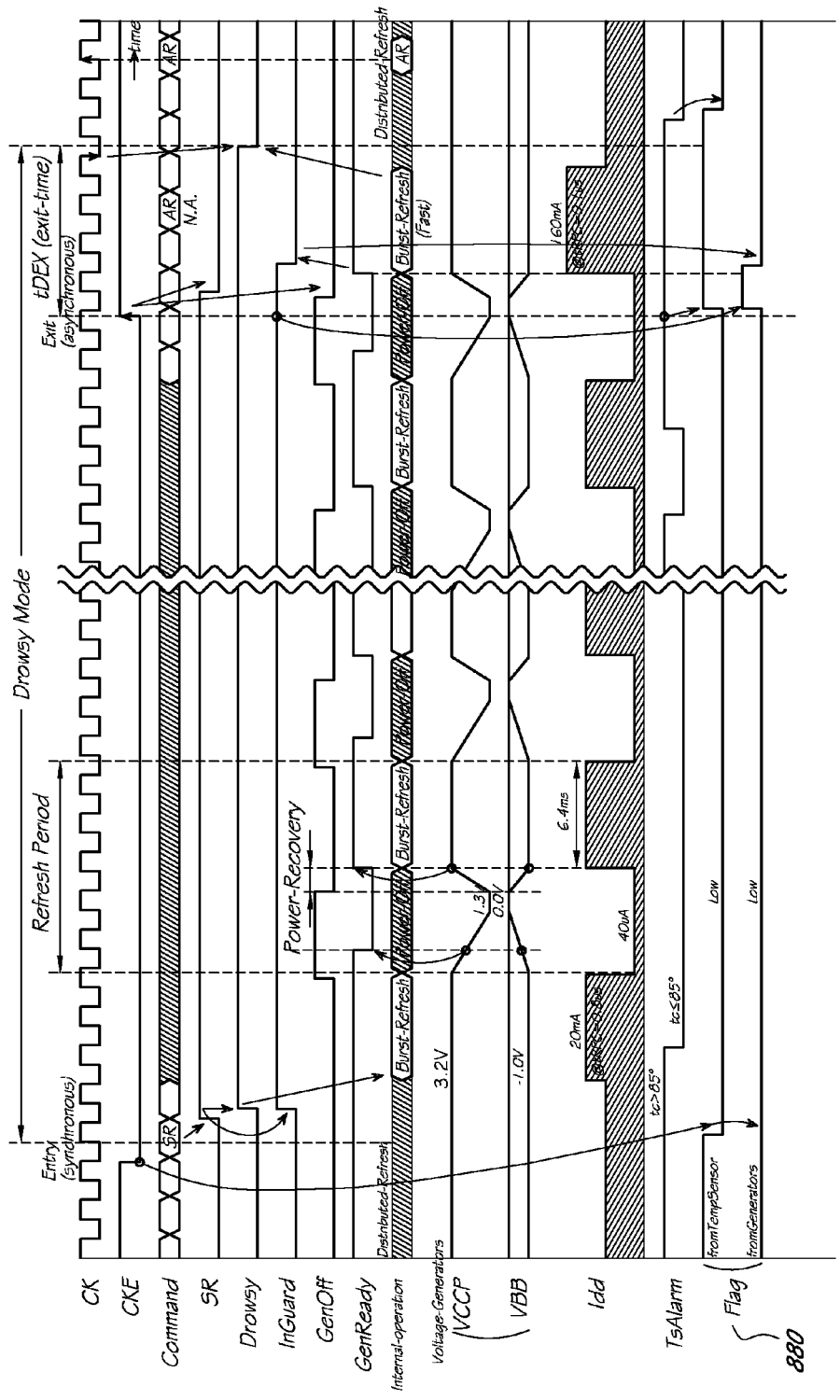
FIG. 13 is an exemplary timing diagram showing timing of signals and commands in a memory system according to an embodiment of the invention.
Figure 14:
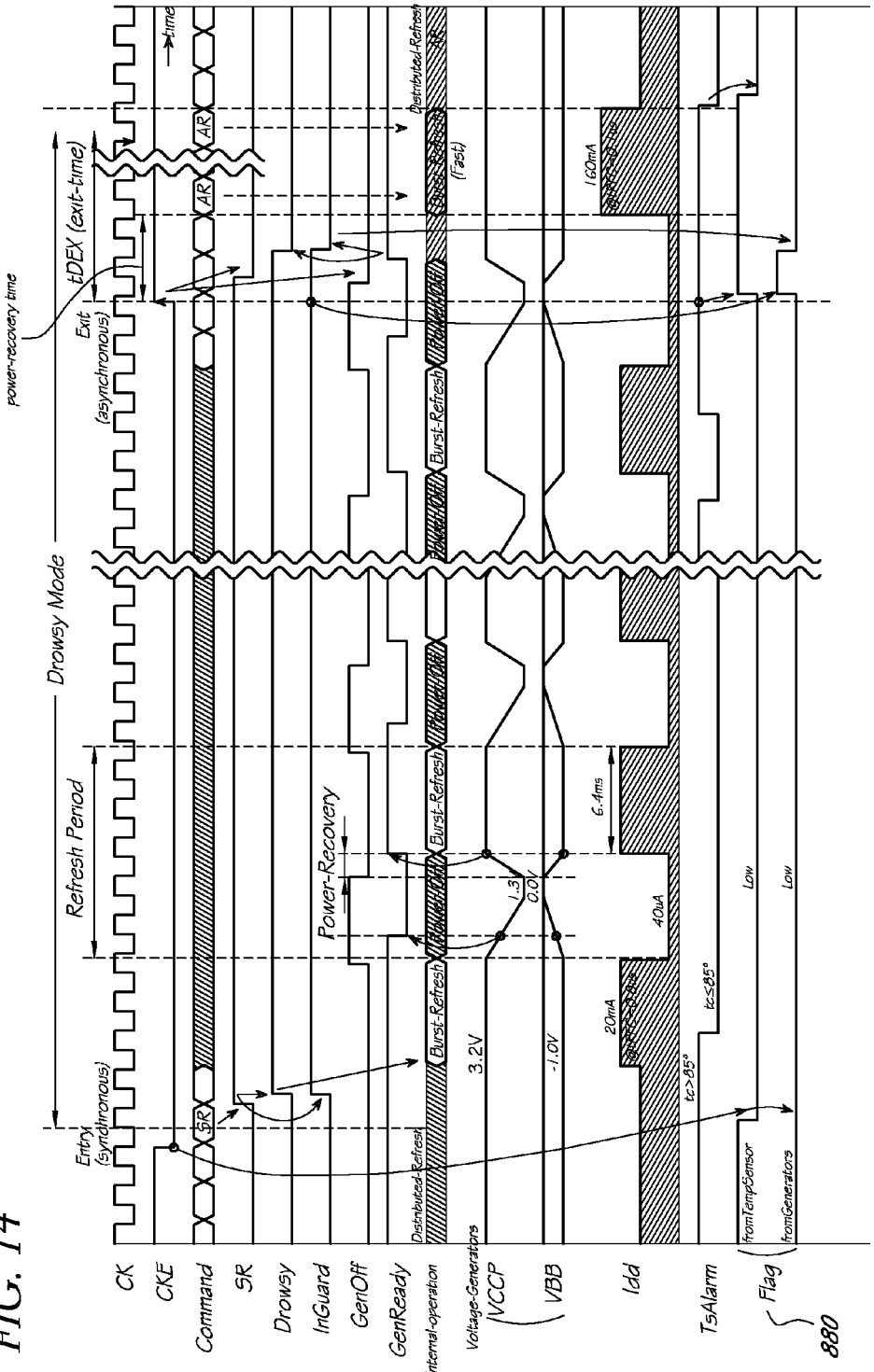
FIG. 14 is an exemplary timing diagram showing timing of signals and commands in a memory system according to an embodiment of the invention.
Figure 15:
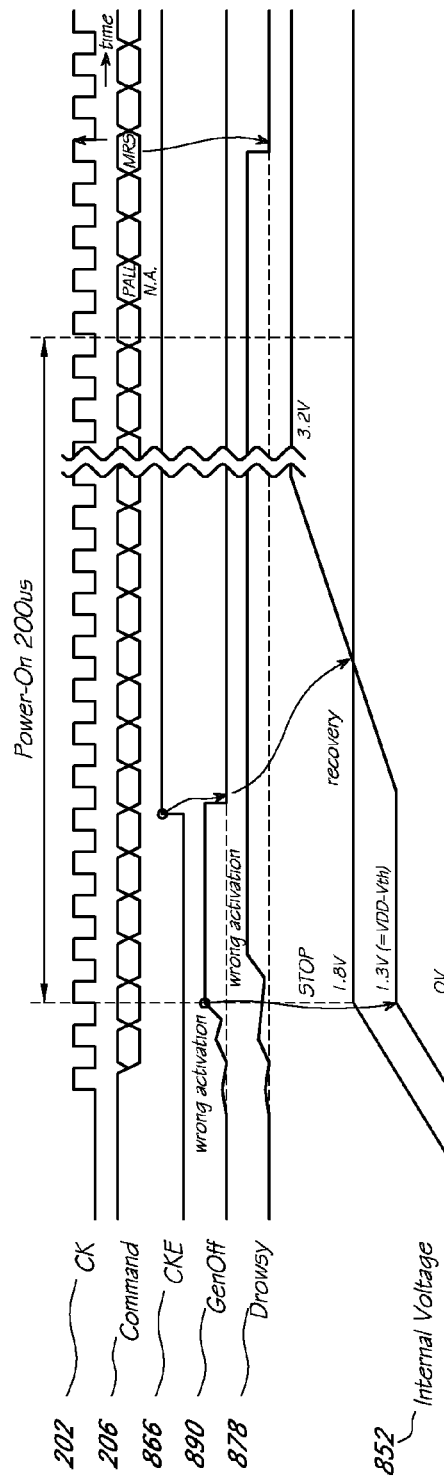
FIG. 15 is an exemplary timing diagram showing timing of signals and commands in a memory system according to an embodiment of the invention.

As shown in FIG. 12, the drowsy signal 878 communicates with the command decoder 802 through reset logic 1204. The reset logic 1204 includes logic circuitry for transmitting the drowsy signal 878 to the command decoder 802. In certain implementations, the drowsy state machine 836 enables the drowsy signal 878 during drowsy mode (see FIGS. 13, 14). The drowsy signal 878 communicates a reset signal through reset logic 1204 to reset lines 1210 ("CLR") on the flip flops 380, preventing the flip flops 380 from issuing commands. In certain embodiments, the reset feature is performed asynchronously but is released by the clock, such that the clock synchronously re-enables the flip flops 380 in the command decoder 802. During exit time, the drowsy state machine 836 disables the drowsy signal 878, and thereby re-enables the command decoder 802 to issue commands (see FIGS. 13, 14).

Figure 11:
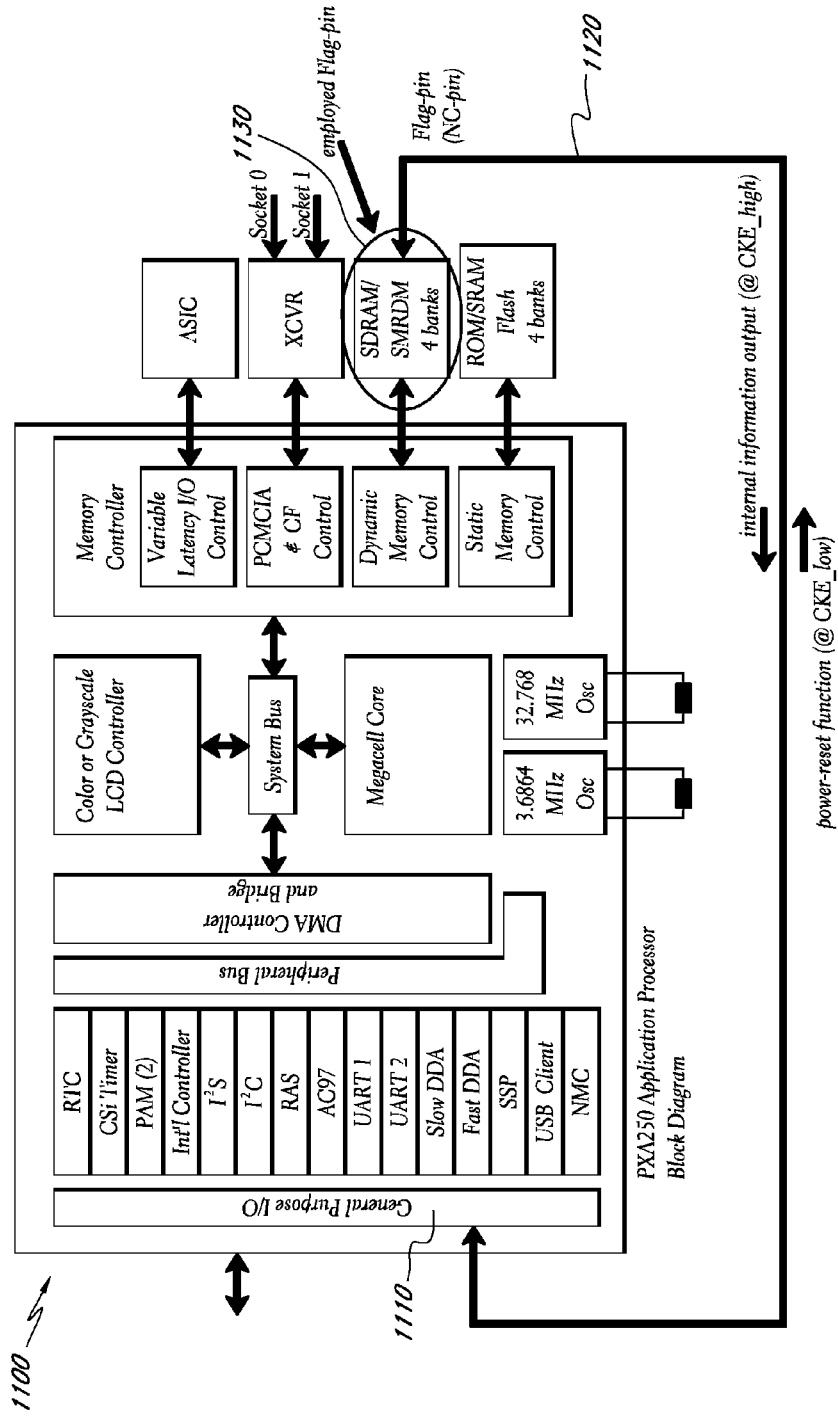
FIG. 11 is an exemplary block diagram showing a controller according to an embodiment of the invention.
Figure 17:
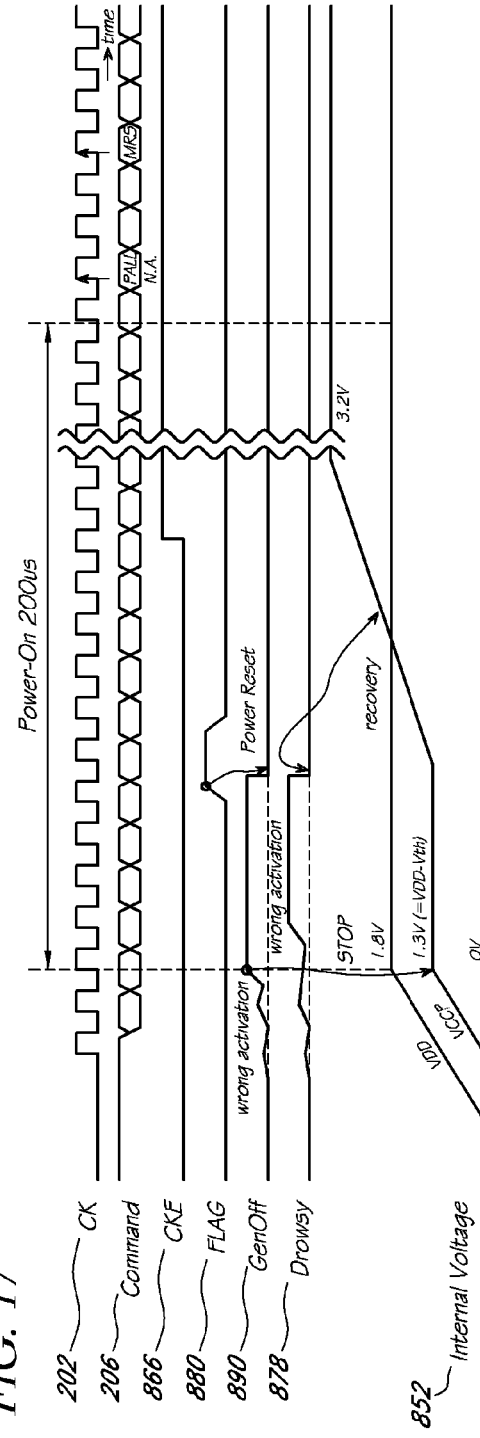
FIG. 17 is an exemplary timing diagram showing timing of signals and commands in a memory system according to an embodiment of the invention.

Another remedy for the above-mentioned problems is to gate the supply voltage (SV) detector 875 with the voltage $V_{DD}$ 874 (as shown in FIG. 8) so that the SV-detected signal can be activated without dependency on internal voltage from the voltage generators 852. Alternatively, a flag signal pin 880 (see FIGS. 9-10) may be employed to allow an external controller to reset the voltage generators 852 and thus prevent freeze failure. One embodiment of such an external controller 1100 is depicted in FIG. 11, which illustrates a general purpose I/O (input/output) port 1110 communicating a reset signal along a bus 1120 to the flag signal pin 880 in the memory banks 1130. FIG. 17 illustrates a waveform of the flag signal pin 880 in operation. In addition, the external controller 1100 in certain embodiments may obtain the state of the control signal 824, the state of internal temperature sensors, and other data from the flag signal pin 880.

Finally, the memory system 800 also includes electrostatic discharge protection (ESD) devices 870 placed on the external inputs 812 in certain embodiments to protect the circuitry of the memory system 800 from electrostatic discharge. The ESD devices 870 include a resistor and transistor pair. While only resistors and transistors are shown, other ESD protection devices may also be employed.

Those of skill will appreciate that the various illustrative logical blocks, modules, circuits, and process steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans can implement the described functionality in varying ways for each particular application, but such implementation decisions should not be interpreted as causing a departure from the scope of the invention. Moreover, skilled artisans will appreciate that references in this specification to enabling signals may include enabling signals with a high logic value or low logic value. Likewise, signals represented as having a high logic value or value "1" may in fact be implemented with low voltage in circuit components, and signals having a low logic value or value "0" may in fact be implemented with higher voltage in circuit components, as is understood in the art.

Although embodiments of this invention has been disclosed herein the invention extends beyond the specifically disclosed embodiments to other alternative embodiments and/or uses of the invention and modifications and equivalents thereof. In particular, while the memory control system and methods have been described herein, certain advantages, features and aspects of the memory control system, device, and method may be realized in a variety of other applications and software systems. Additionally, it is contemplated that various aspects and features of the invention described can be practiced separately, combined together, or substituted for one another, and that a variety of combination and subcombinations of the features and aspects can be made and still fall within the scope of certain embodiments of the invention. Furthermore, the systems described above need not include all of the modules and functions described above. Thus, it is intended that the scope of the present invention herein disclosed should not be limited by the disclosed embodiments described above, but should be defined by the appended claims.

What is claimed is:

1. A semiconductor integrated circuit device comprising:
   a command decoder configured to control a memory system by decoding a memory system input signal, the command decoder further configured to receive the memory system input signal and a control signal, and to disable the memory system input signal based at least in part on the control signal;
   self-refresh logic configured to provide a self-refresh signal based at least in part on an external clock enable signal, the control signal based at least in part on the self-refresh signal; and
   a path-gate electrically coupled to the self-refresh logic and configured to receive the external clock enable signal and provide the external clock enable signal to the self-refresh logic, the path-gate receiving power from a main voltage generator and a secondary voltage generator in the event that the main voltage generator powers off.

2. The semiconductor integrated circuit device of claim 1 wherein the main voltage generator is configured to provide a generator state signal indicating a voltage level of the main voltage generator.

3. The semiconductor integrated circuit device of claim 2 wherein the control signal is based at least in part on the self-refresh signal and the generator state signal.

4. The semiconductor integrated circuit device of claim 3 wherein the control signal causes the command decoder to disable the memory system input signal when the main voltage generator is not fully powered-on.

5. The semiconductor integrated circuit device of claim 3 wherein the control signal causes the command decoder to disable the memory system input signal when the memory system is performing self-refresh operations.

6. The semiconductor integrated circuit device of claim 1 further comprising clock enable logic operative to control at least one secondary voltage generator.

7. The semiconductor integrated circuit device of claim 1 wherein the self-refresh signal controls the control signal during drowsy mode.

8. The semiconductor integrated circuit device of claim 2 wherein the generator state signal controls the control signal during power recovery of the main voltage generator.

9. The semiconductor integrated circuit device of claim 1 wherein the memory system input signal comprises one or more of a row-address strobe signal, a column-address signal, a chip select signal, a write enable signal, and a clock signal.

10. The semiconductor integrated circuit device of claim 1 further comprising a second path-gate configured to receive the memory system input signal and provide the memory system input signal to the command decoder, the second path-gate receiving power from the main voltage generator and the secondary voltage generator such that the command decoder receives the memory system input signal in the event that the main voltage generator powers off.

11. The semiconductor integrated circuit device of claim 2 further comprising a drowsy state machine configured to receive the external clock enable signal, the self-refresh signal, and the generator state signal, and provide the control signal to the command decoder.

12. The semiconductor integrated circuit device of claim 1 wherein the external clock enable signal is based at least in part on a self-refresh command from the command decoder and a self-refresh command from a user-generated action.

13. The semiconductor integrated circuit device of claim 1 further comprising a clamp transistor electrically coupled to the main voltage generator and the secondary voltage generator and configured to enable the main voltage generator to assist the secondary voltage generator to reach full voltage levels.

14. The semiconductor integrated circuit device of claim 1 wherein the control signal prevents the memory system input signal from initiating a command during exit from drowsy mode.

15. The semiconductor integrated circuit device of claim 14 wherein the control signal further prevents the command from issuing from the command decoder during the exit from the drowsy mode.

16. A semiconductor integrated circuit device comprising:
a command decoder configured to receive one or more external memory command signals and a control signal having a first state and a second state, the command decoder further configured to decode the one or more external memory command signals into memory system commands when the control signal is in the first state and prevent the one or more external memory command signals from initiating the memory system commands when the control signal is in the second state;
self-refresh logic configured to receive an external clock enable signal and provide a self-refresh signal based at least in part on the external clock enable signal, the control signal based at least in part on the self-refresh signal; and
a path-gate electrically coupled to the self-refresh logic and configured to receive the external clock enable signal and provide the external clock enable signal to the self-refresh logic, the path-gate receiving power from a main voltage generator and a secondary voltage generator such that the self-refresh logic receives the external clock enable signal in the event that the main voltage generator powers off.

17. The semiconductor integrated circuit device of claim 16 wherein the main voltage generator is configured to provide a generator state signal indicating a voltage level of the main voltage generator, the control signal based at least in part on the self-refresh signal and the generator state signal.

18. The semiconductor integrated circuit device of claim 17 wherein the command decoder is further configured to prevent the one or more external memory command signals from initiating the memory system commands to reduce command hazards when exiting drowsy mode.

19. The semiconductor integrated circuit device of claim 16 wherein the one or more external memory command signals comprise one or more of a row-address strobe signal, a column-address signal, a chip select signal, a write enable signal, and a clock signal.

20. The semiconductor integrated circuit device of claim 17 further comprising a drowsy state machine configured to receive the external clock enable signal, the self-refresh signal, and the generator state signal, and provide the control signal to the command decoder.

* * * * *